(12) United States Patent
Aichi

(10) Patent No.: US 11,088,522 B2
(45) Date of Patent: Aug. 10, 2021

(54) CIRCUIT ASSEMBLY AND ELECTRICAL JUNCTION BOX

(71) Applicant: Sumitomo Wiring Systems, Ltd., Yokkaichi (JP)

(72) Inventor: Junya Aichi, Yokkaichi (JP)

(73) Assignee: Sumitomo Wiring Systems, Ltd., Yokkaichi (JP)

( * ) Notice: Subject to any disclaimer, the term of this patent is extended or adjusted under 35 U.S.C. 154(b) by 0 days.

(21) Appl. No.: 16/969,694

(22) PCT Filed: Jan. 29, 2019

(86) PCT No.: PCT/JP2019/002838
§ 371 (c)(1),
(2) Date: Aug. 13, 2020

(87) PCT Pub. No.: WO2019/159678
PCT Pub. Date: Aug. 22, 2019

(65) Prior Publication Data
US 2021/0006056 A1    Jan. 7, 2021

(30) Foreign Application Priority Data

Feb. 13, 2018   (JP) .............................. JP2018-022833

(51) Int. Cl.
*H01R 12/51*   (2011.01)
*H02G 3/16*   (2006.01)
*H05K 1/18*   (2006.01)

(52) U.S. Cl.
CPC ............... *H02G 3/16* (2013.01); *H01R 12/51* (2013.01); *H05K 1/181* (2013.01)

(58) Field of Classification Search
CPC ...................................................... H01R 12/51
USPC ........................................................ 361/752
See application file for complete search history.

(56) References Cited

U.S. PATENT DOCUMENTS

| | | |
|---|---|---|
| 2006/0120001 A1 | 6/2006 | Weber et al. |
| 2015/0372554 A1* | 12/2015 | Hashimoto .............. H02K 3/50 310/71 |
| 2020/0194984 A1* | 6/2020 | Tsuchida ................ H02G 3/081 |
| 2020/0411231 A1* | 12/2020 | Tsuchida ................ H01F 27/02 |

FOREIGN PATENT DOCUMENTS

| | | |
|---|---|---|
| JP | S49-115641 U | 10/1974 |
| JP | 191190/1987 | * 12/1987 |
| JP | S62-191190 U | 12/1987 |

(Continued)

OTHER PUBLICATIONS

International Search Report, Application No. PCT/JP2019/002838, dated Apr. 16, 2019. ISA/Japan Patent Office.

*Primary Examiner* — Stanley Tso
(74) *Attorney, Agent, or Firm* — Honigman LLP

(57) ABSTRACT

A circuit assembly includes a substrate having a conductive path, electronic components mounted on the substrate, and a terminal block that is in contact with the substrate, in which the terminal block includes a terminal portion that is connectable to a counterpart terminal, a terminal holding portion for holding the terminal portion, and support portions for supporting the terminal holding portion, and the electronic components are disposed between the terminal holding portion and the substrate.

7 Claims, 6 Drawing Sheets

(56) References Cited

FOREIGN PATENT DOCUMENTS

| | | |
|---|---|---|
| JP | S62-198680 U | 12/1987 |
| JP | H11-095809 A | 4/1999 |
| JP | 2004-152947 A | 5/2004 |

\* cited by examiner

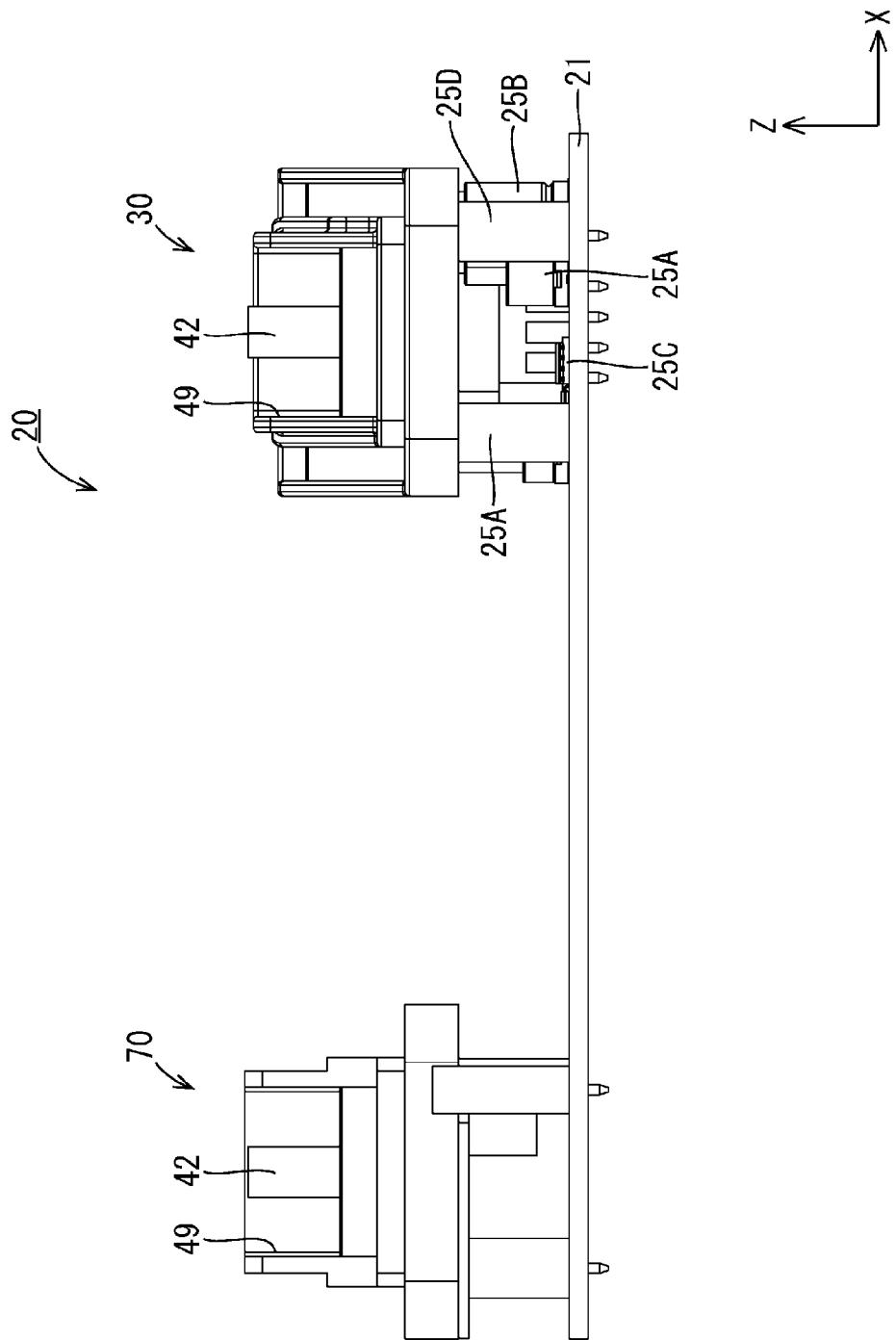

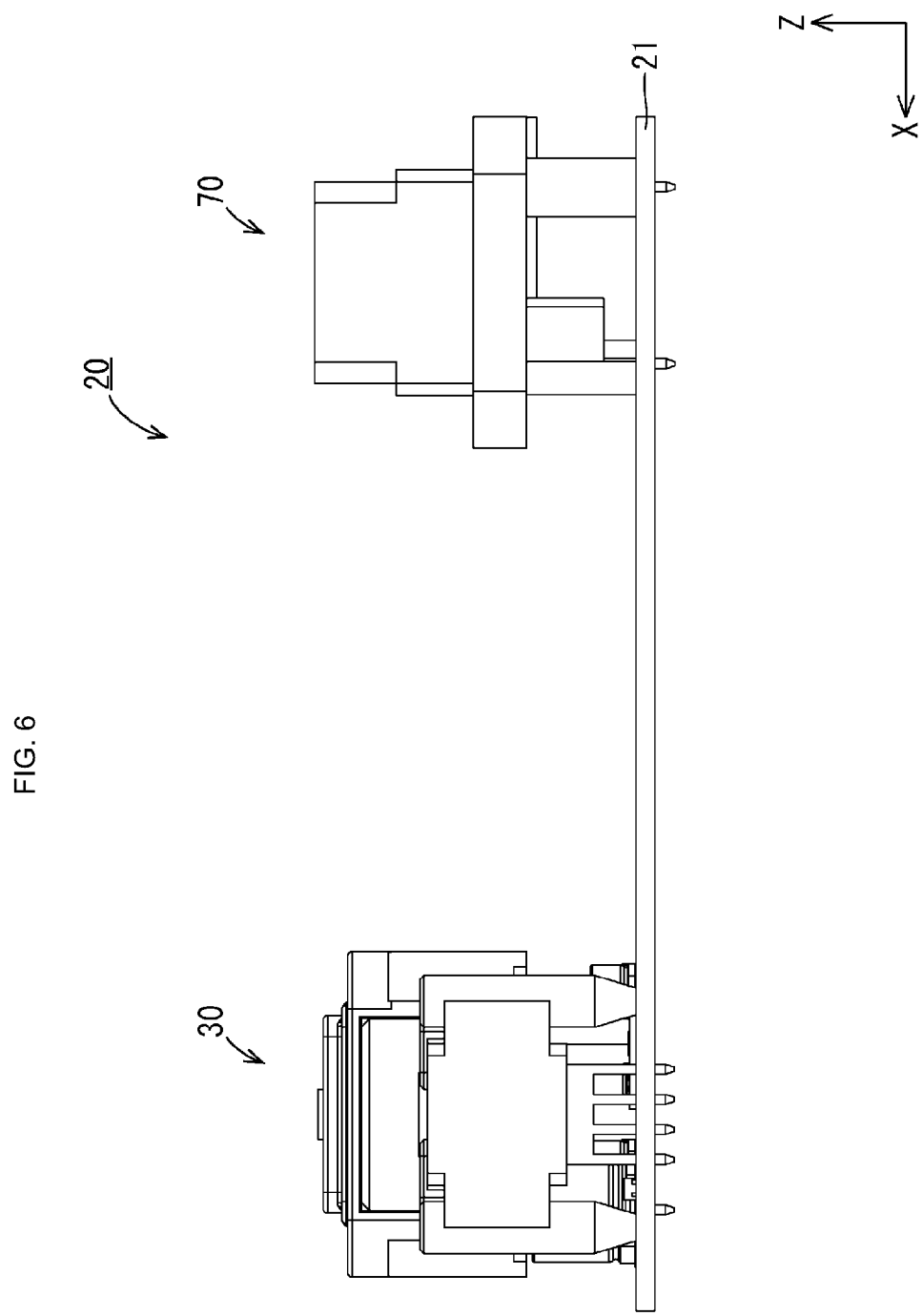

CIRCUIT ASSEMBLY AND ELECTRICAL JUNCTION BOX

CROSS-REFERENCE TO RELATED APPLICATIONS

This application is the U.S. national stage of PCT/JP2019/002838 filed on Jan. 29, 2019, which claims priority of Japanese Patent Application No. JP 2018-022833 filed on Feb. 13, 2018, the contents of which are incorporated herein.

TECHNICAL FIELD

This specification will disclose technology relating to a circuit assembly and an electrical junction box.

BACKGROUND

Conventionally, technology with which electronic components are mounted on a substrate is known. In JP 2004-152947A, a recess is formed in a first electronic component, which is an inductor component mounted on a mounting substrate. A second electronic component, which is a capacitor component, is mounted on the mounting substrate in the recess of the first electronic component. Accordingly, the size of the mounting substrate is reduced by reducing the mounting area by the mounting area of the second electronic component.

Incidentally, with the above-described configuration, although the size of a mounting substrate can be reduced by disposing the second electronic component in the recess of the inductor component, a recess needs to be provided in the first electronic component that is the inductor component, and thus there is an issue in that the shape of the inductor component will be complicated, and manufacturing costs will increase.

Technology disclosed in this specification has been made based on the above-described circumstances, and aims to provide a circuit assembly and an electrical junction box with which the size of a substrate can be reduced while reducing manufacturing costs.

SUMMARY

A circuit assembly disclosed in this specification includes a substrate having a conductive path, an electronic component mounted on the substrate, and a terminal block that is in contact with the substrate, in which the terminal block includes a terminal portion that is connectable to a counterpart terminal, a terminal holding portion for holding the terminal portion, and a support portion for supporting the terminal holding portion, and the electronic component is disposed between the terminal holding portion and the substrate.

According to this configuration, the electronic component mounted on the substrate is disposed between the terminal holding portion and the substrate, and thus it is possible to increase a space on the substrate in which the electronic component can be accommodated. Accordingly, it is possible to increase the density of electronic components mounted on a substrate, and thus to reduce the size of the substrate. Also, because a terminal holding portion and a support portion need only be processed into shapes that allow electronic components to be accommodated, it is possible to reduce manufacturing costs (compared to a configuration in which the shape of an inductor is processed). Thus, it is possible to reduce the size of a substrate while reducing manufacturing costs.

An embodiment of the technology disclosed in this specification preferably have the following aspects.

The circuit assembly includes an extension portion that is continuous with the terminal portion and extends along a surface of the substrate, in which the extension portion is enveloped by a magnetic core.

This makes it possible to reduce high-frequency noise caused by an electric current flowing through the extension portion, with use of the magnetic core.

A detection portion for detecting a voltage of the terminal portion is branched from the extension portion, and the detection portion is connected to a conductive path of the substrate.

This makes it possible to detect the voltage of the terminal portion, utilizing the configuration of the extension portion.

An extension holding portion for holding the extension portion extends from at least one of the terminal holding portion and the support portion, and the extension holding portion has a fitting portion that is cut out such that the magnetic core is fitted around the fitting portion.

This makes it possible to maintain the position of the magnetic core on the terminal block, with use of a simple configuration.

The terminal portion is an output terminal for outputting power to the counterpart terminal.

This makes it possible to dispose the terminal block and the magnetic core on a power outputting side, and thus it is possible to reduce noise generated to an external portion.

An electrical junction box includes the circuit assembly and a case for housing the circuit assembly.

Advantageous Effects of Disclosure

According to the technology disclosed in this specification, it is possible to provide a circuit assembly and an electrical junction box with which the size of a substrate can be reduced while reducing manufacturing costs.

BRIEF DESCRIPTION OF DRAWINGS

FIG. 5 is a left side view showing the circuit assembly.
FIG. 6 is a right side view showing the circuit assembly.

DETAILED DESCRIPTION OF PREFERRED EMBODIMENTS

An embodiment will be described with reference to FIGS. 1 to 6.

An electrical junction box 10 is disposed in a power supply path located between a power source such as a battery of a vehicle such as an electric car or a hybrid automobile, and a load constituted by an onboard electrical component such as a lamp or a driving motor, for example, and the electrical junction box 10 may be used as a DC-DC converter, an invertor, or the like. In the following description, the terms "right" and "up" respectively refer to the Y-direction and the Z-direction in FIG. 1, and the term "front" refers to the X-direction in FIG. 2.

Figure 1:
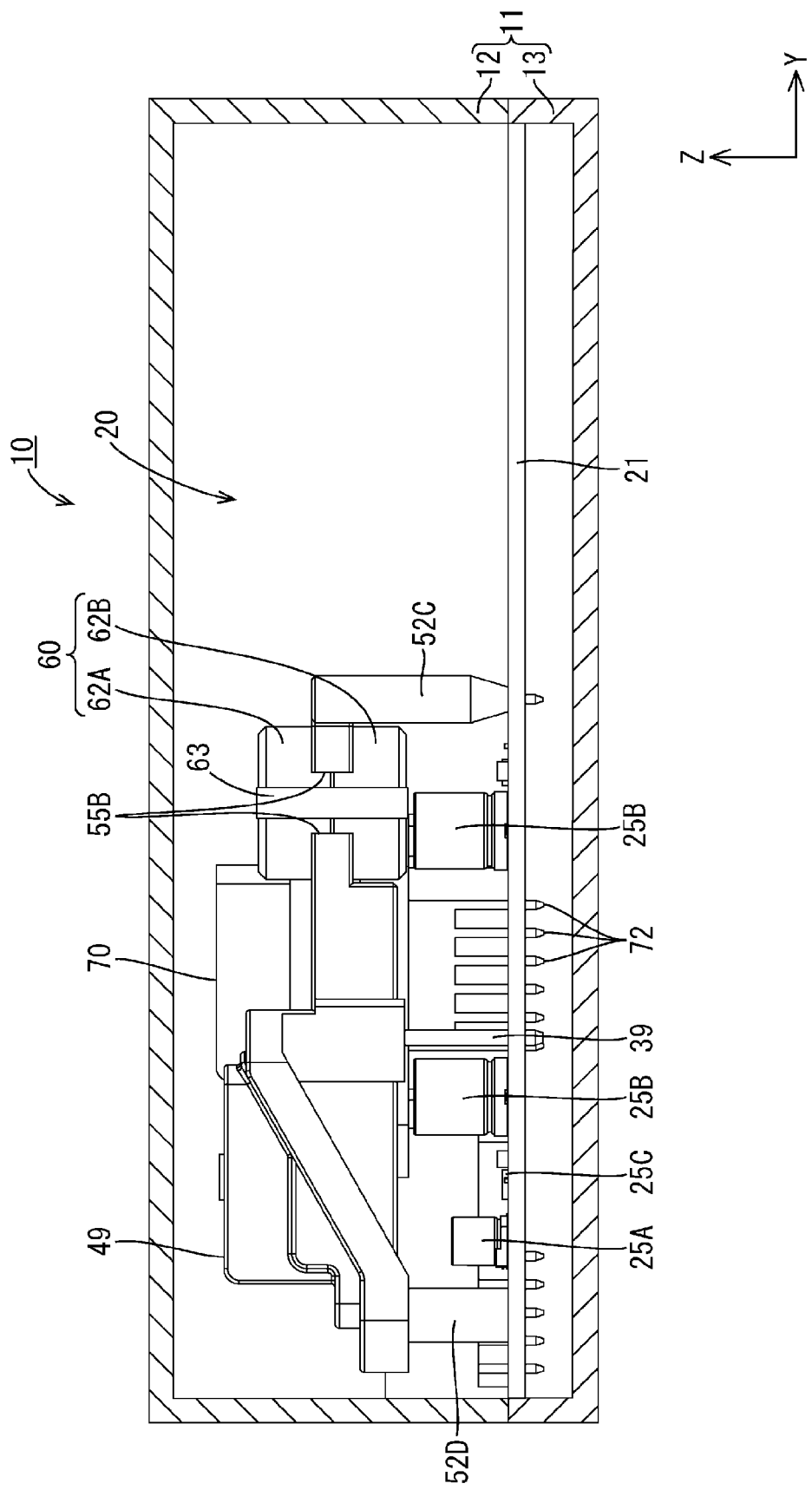
FIG. 1 is a cross-sectional view showing an electrical junction box of an embodiment.

As shown in FIG. 1, the electrical junction box 10 includes a circuit assembly 20 and a case 11 for housing the circuit assembly 20. The case 11 is made of a synthetic resin or metal, and includes a lower case 13 and an upper case 12 fitted to the lower case 13.

Figure 2:
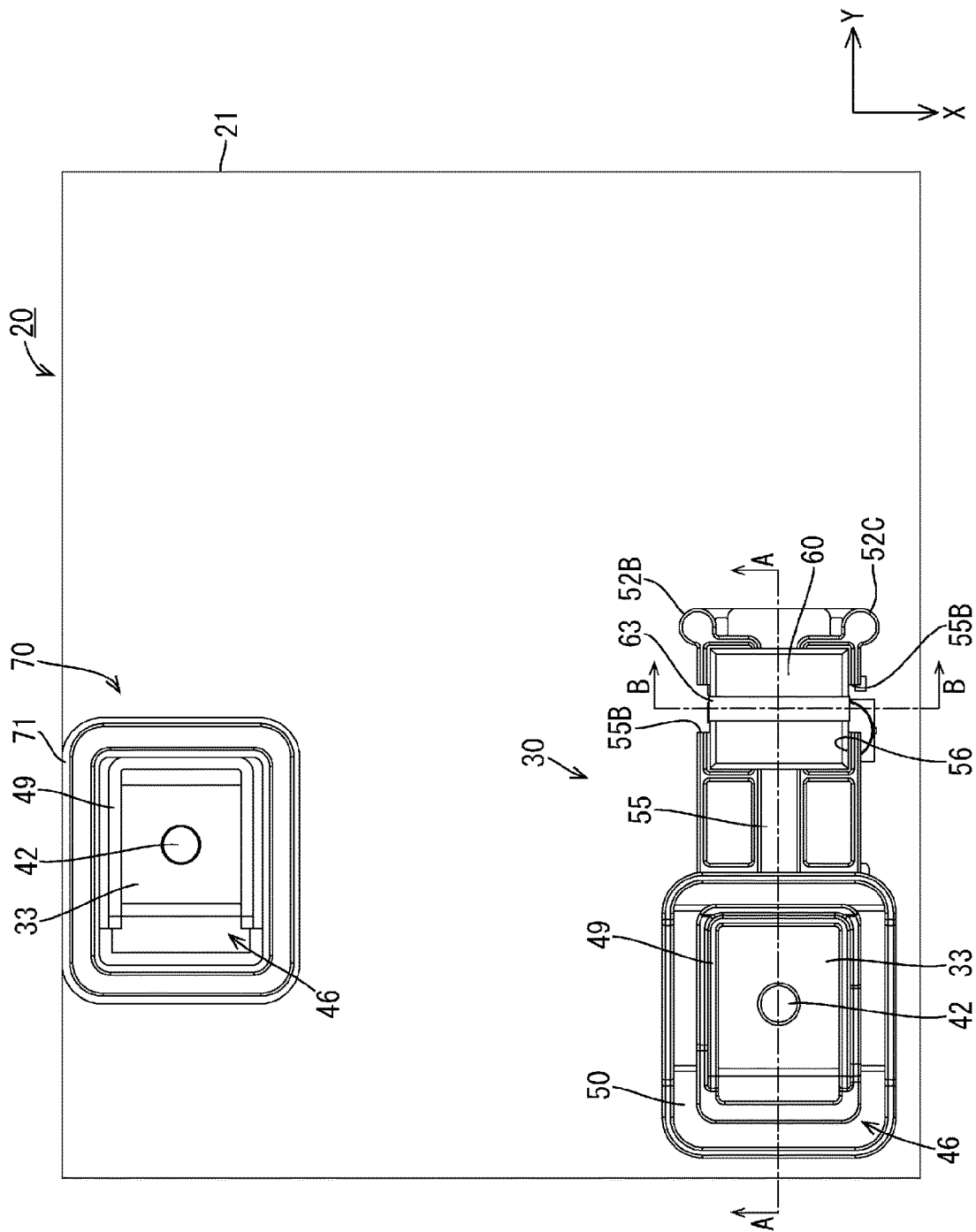
FIG. 2 is a plan view showing a circuit assembly.
Figure 3:
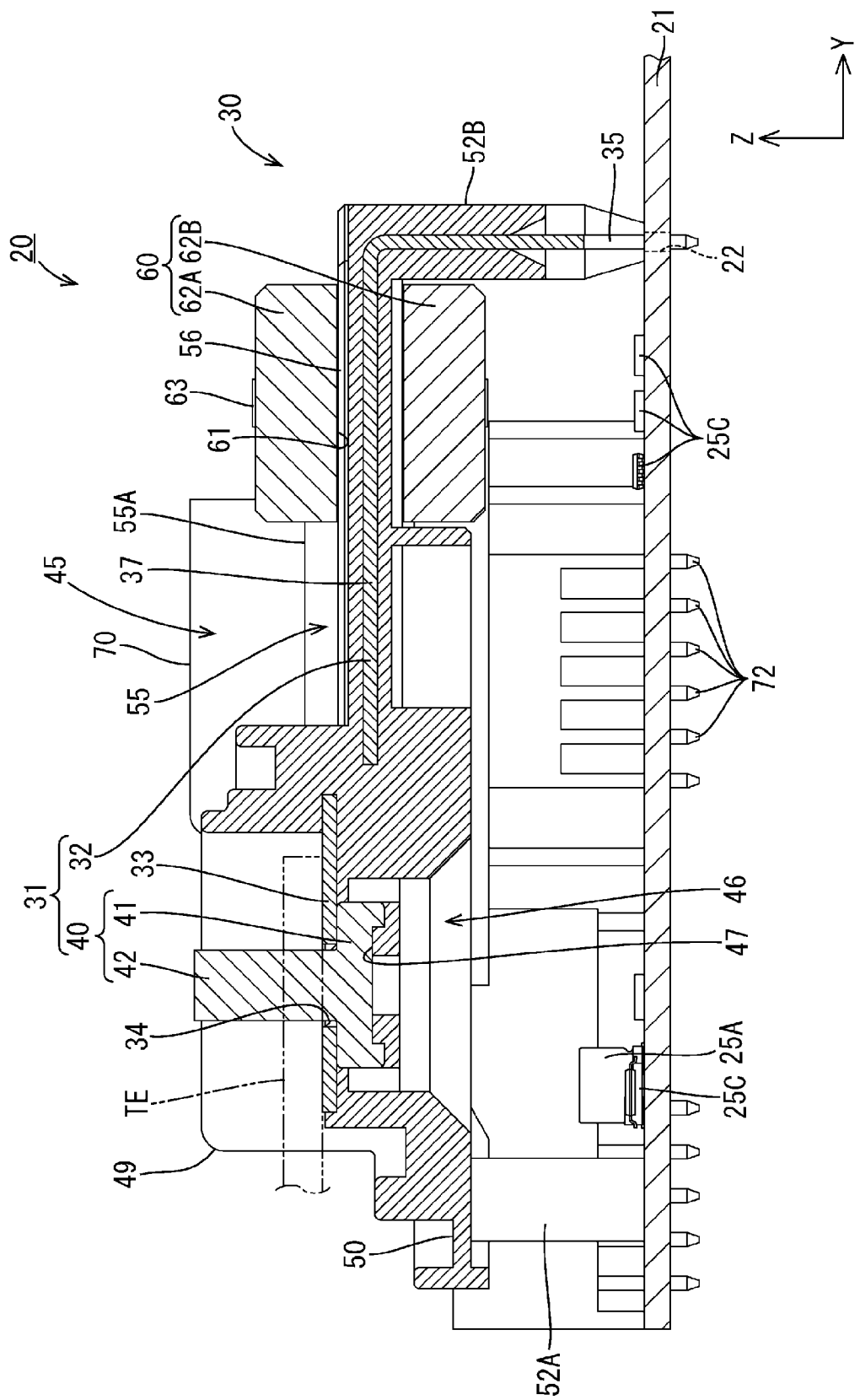
FIG. 3 is a cross-sectional view taken along A-A in FIG. 2.
Figure 4:
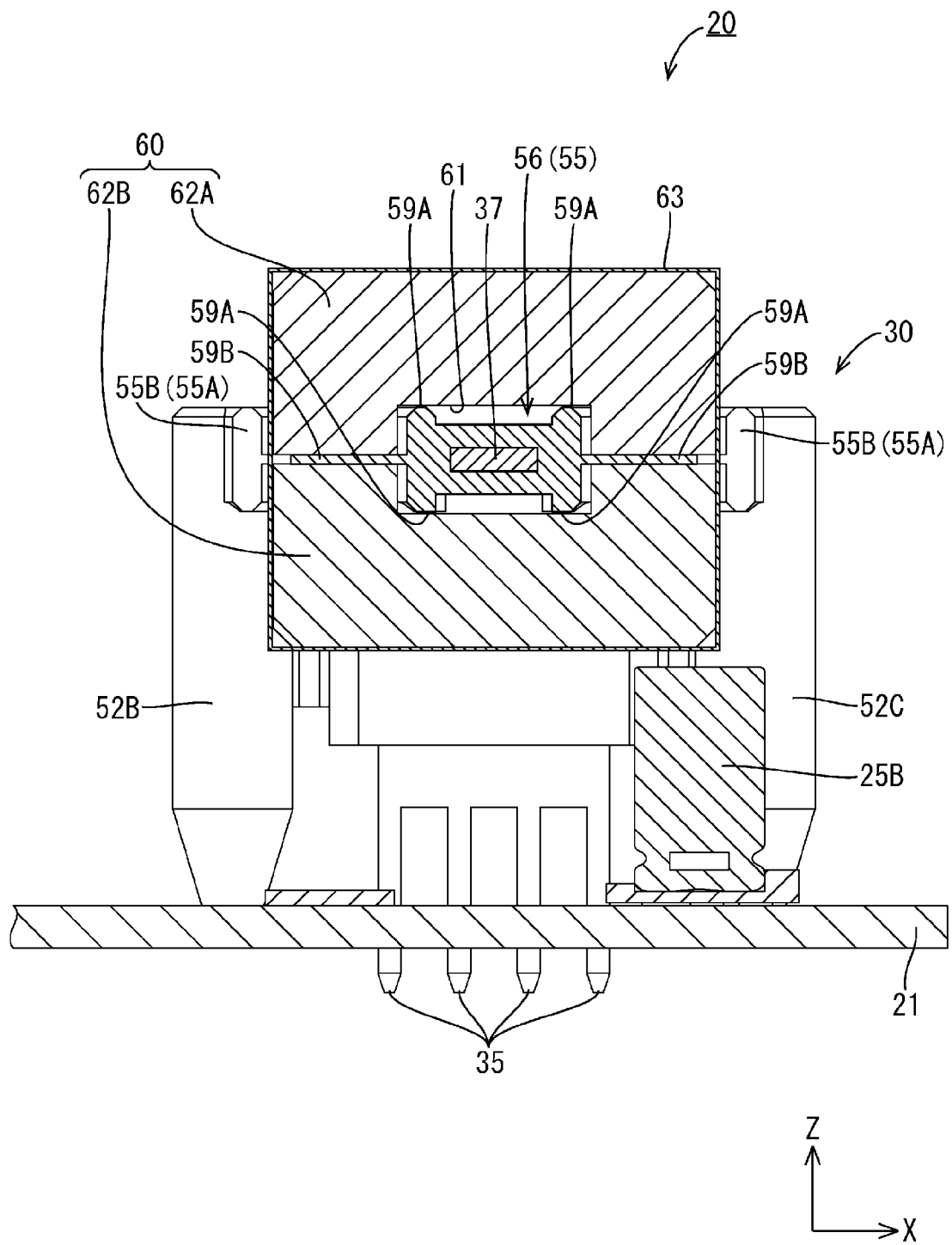
FIG. 4 is a cross-sectional view taken along B-B in FIG. 2.

As shown in FIGS. 2 to 4, the circuit assembly 20 includes a substrate 21 having a conductive path, electronic components 25A to 25C mounted on the substrate 21 (other electronic components mounted on a surface of the substrate 21 are not shown in FIG. 2), a plurality of terminal blocks 30 and 70 placed on the substrate 21. The substrate 21 is a printed circuit board in which a conductive path (not shown) made of a copper film or the like is formed on an insulating plate constituted by an insulating material, through printed wiring. Note that a substrate is not limited to a printed circuit board, and a substrate obtained by placing a metal plate material made of copper, a copper alloy, or the like on a printed circuit board may be used as a substrate. A plurality of through-holes 22 that are continuous with a conductive path are formed in the substrate 21.

The electronic components 25A to 25C have a plurality of lead terminals connected to the conductive path of the substrate 21. The plurality of lead terminals are soldered to the conductive path of the substrate 21. At least one of the electronic components 25A to 25C mounted on the substrate 21 is disposed below the terminal block 30. In this embodiment, capacitors and FETs (Field Effect Transistors) serving as the electronic components 25A to 25C are mounted on the substrate 21 at positions located below the terminal block 30 (positions overlapping the terminal block 30). Note that an electronic component is not limited to a capacitor or a FET, and may be a resistor, a coil, or the like, for example.

As shown in FIG. 3, the terminal block 30 includes a metal conductive portion 31 through which an electric current to be output to an external portion flows, and a base portion 45 that is made of an insulating synthetic resin and is in intimate contact with the conductive portion 31. The conductive portion 31 includes a conductive main body 32 constituted by a flat metal plate material made of copper, a copper alloy, or the like, and a stud bolt 40 connected to the conductive main body 32.

The conductive main body 32 is long in the right-left direction, and includes a terminal connection portion 33 connected to the stud bolt 40, a plurality of substrate connection terminals 35 connected to the conductive path of the substrate 21, and an extension portion 37 that extends in a belt shape to connect the terminal connection portion 33 and the substrate connection terminals 35. The terminal connection portion 33 is provided with a circular insertion hole 34 that passes through the terminal connection portion 33 and into which a terminal portion 42 of the stud bolt 40 is inserted.

Each substrate connection terminal 35 has a rod shape, and as shown in FIG. 4, the substrate connection terminals 35 are spaced apart from each other at predetermined intervals and are arranged side-by-side in one row, and the substrate connection terminals 35 are electrically connected to the conductive path of the substrate 21 as a result of the substrate connection terminals 35 being inserted into and being soldered to through-holes 22 of the substrate 21. The extension portion 37 is bent in an L-shape on the substrate connection terminal 35 side. Also, the extension portion 37 is bent in a step shape on the terminal connection portion 33 side, and is continuous with the terminal connection portion 33 located at a position that is one-step higher. A rod-shaped detection portion 39 (see FIG. 1) is branched from a substantially intermediate portion of the extension portion 37 in the right-left direction. The detection portion 39 is electrically connected to the conductive path of the substrate 21 as a result of the detection portion 39 being inserted into and being soldered to a through-hole 22 of the substrate 21. The detection portion 39 outputs the voltage of the terminal portion 42 to a control circuit portion (not shown) provided on the right side of the terminal block 30 on the substrate 21. The above-described conductive main body 32 can be formed by stamping and bending a metal plate material with use of a press-machine.

As shown in FIG. 3, the stud bolt 40 has a circular plate-shaped head portion 41, and a terminal portion 42 that protrudes upward of the head portion 41 and serves as a round columnar shaft portion whose outer diameter is smaller than that of the head portion 41. The upper surface of the head portion 41 and the flat plate portion are fixed to each other through welding, for example. The terminal portion 42 is connectable to a counterpart terminal TE to be connected to an end portion of an external electrical wire, for example.

The base portion 45 includes a terminal holding portion 46 for holding the terminal portion 42, four support portions 52A to 52D that are placed on the substrate 21 and support the terminal holding portion 46, and an extension holding portion 55 for holding the extension portion 37 of the conductive portion 31. The terminal holding portion 46 includes an accommodation portion 47 for accommodating the head portion 41 of the stud bolt 40, an insulating wall 49 for three-dimensionally enveloping the terminal portion 42, and a groove portion 50 disposed around the insulating wall 49. The head portion 41 of the stud bolt 40 can be fitted to the accommodation portion 47 from above.

The four support portions 52A to 52D are round columnar four legs provided at the positions of the four corners of the terminal block 30 on the bottom surface side, and the support portions 52A and 52D located on the left side (the terminal holding portion 46 side) have a shorter height and a wider outer diameter than the two support portions 52C and 52D located on the right side (the extension holding portion 55 side). Also, the lower end portions of the two support portions 52C and 52D located on the right side have a tapered shape. Note that lower surfaces of the support portions 52A and 52D located on the left side are provided with screw holes (not shown), and the substrate 21 may be fixed to the support portions 52A and 52D by fastening screws (not shown) into the screw holes of the support portions 52A and 52D from the lower side of the substrate 21.

The extension holding portion 55 covers the extension portion 37 and extends in the right-left direction, and includes a fitting portion 56 that is inserted into the magnetic core 60 and around which the magnetic core 60 is fitted, and a pair of wall portions 55A that extend upward from two edges of the extension holding portion 55 extending in the width direction. The wall portions 55A are provided with cutout portions 55B that are separated at an intermediate portion of the magnetic core 60 in the right-left direction, and a piece of tape 63 can be directly wrapped around the surface of the magnetic core 60 that is continuous with the wall portions 55A due to the cutout portions 55B. The fitting portion 56 is configured such that resin is in intimate contact with the entire surface of the extension portion 37, and as shown in FIG. 4, the fitting portion 56 passes through an insertion hole 61 of the magnetic core 60. Each corner portion of the fitting portion 56 is provided with a rib 59A that protrudes upward or downward. Also, the extension holding portion 55 is provided with a pair of right and left spacer portions 59B held between separation members 62A and 62B.

The magnetic core 60 is constituted by a magnetic material such as ferrite and is provided with the rectangular insertion hole 61 that passes through the magnetic core 60 and into which the fitting portion 56 of the extension holding portion 55 is inserted, and the magnetic core 60 is configured such that the two separation members 62A and 62B having the same shape face each other. The magnetic core 60 is fixed to the fitting portion 56 in a state in which separation of the separation members 62A and 62B is restricted due to the tape 63 being wrapped in a state in which the separation members 62A and 62B are fitted together.

Note that unlike the terminal block 30, the other terminal block 70 is not provided with the extension holding portion 55 or the magnetic core 60, and as shown in FIG. 2, the terminal block 70 includes the terminal portion 42 as an input terminal to which power is input from an external portion, and a base portion 71 that is made of an insulating synthetic resin and receives the terminal portion 42. The terminal portion 42 of the terminal block 70 is held by the terminal holding portion 46, is connected to a substrate connection terminal 72 (see FIG. 1), and is connected to a conductive path of the substrate 21 via the substrate connection terminal 72. With regard to the terminal block 70, the electronic components 25A to 25C may also be disposed between the terminal holding portion 46 and the substrate 21.

Assembly of the electrical junction box 10 will be described.

The electronic components 25A to 25C are placed on the substrate 21 to which solder is applied, and the electronic components 25A to 25C are soldered to the substrate 21 through reflow soldering, for example. Also, the conductive portion 31 is formed by welding the stud bolt 40 to the conductive main body 32, and the terminal block 30 is formed through insert molding with the conductive portion 31 disposed in a mold. Then, the support portions 52A to 52D of the terminal block 30 are placed on the substrate 21 while the substrate connection terminals 35 and the detection portion 39 of the terminal block 30 are inserted into the through-holes 22 of the substrate 21, and the substrate connection terminals 35 and the detection portion 39 are soldered to the through-holes 22 of the substrate 21 through flow soldering, for example. Accordingly, the circuit assembly 20 is formed. The electrical junction box 10 is formed by covering the circuit assembly 20 with the upper case 12 and the lower case 13 from above and below.

Effects of this embodiment will be described.

The circuit assembly 20 includes the substrate 21 having a conductive path, the electronic components 25A to 25C mounted on the substrate 21, and the terminal block 30 that is in contact with the substrate 21, in which the terminal block 30 includes the terminal portion 42 that is connectable to a counterpart terminal TE, the terminal holding portion 46 for holding the terminal portion 42, and the support portions 52A to 52D for supporting the terminal holding portion 46, and the electronic components 25A to 25C are disposed between the terminal holding portion 46 and the substrate 21.

According to this configuration, the electronic components 25A to 25C mounted on the substrate 21 are disposed between the terminal holding portion 46 and the substrate 21, and thus it is possible to increase a space on the substrate 21 in which the electronic components 25A to 25C can be accommodated. Accordingly, it is possible to increase the density of electronic components 25A to 25C mounted on the substrate 21, and thus to reduce the size of the substrate 21. Also, because the base portion 45 made of a synthetic resin need only be processed into a shape that allows the electronic components 25A to 25C to be accommodated, it is possible to reduce manufacturing costs (compared to a configuration in which the shape of an inductor is processed). Thus, it is possible to reduce the size of the substrate 21 while reducing manufacturing costs.

Also, the circuit assembly includes the extension portion 37 that is continuous with the terminal portion 42 and extends along a surface of the substrate 21, and the extension portion 37 is enveloped by the magnetic core 60.

This makes it possible to reduce high-frequency noise caused by an electric current flowing through the extension portion 37, with use of the magnetic core 60.

Also, the detection portion 39 for detecting the voltage of the terminal portion 42 is branched from the extension portion 37, and the detection portion 39 is connected to a conductive path of the substrate 21.

This makes it possible to detect the voltage of the terminal portion 42, utilizing the configuration of the extension portion 37.

Also, the base portion 45 includes the extension holding portion 55 for holding the extension portion 37, and the extension holding portion 55 has the fitting portion 56 that is cut out such that the magnetic core 60 is fitted around the fitting portion.

This makes it possible to maintain the position of the magnetic core 60 on the terminal block 30, with use of a simple configuration.

Also, the terminal portion 42 is an output terminal for outputting power to the counterpart terminal TE.

This makes it possible to dispose the terminal block 30 and the magnetic core 60 on the power outputting side, and thus it is possible to reduce noise generated to an external portion.

OTHER EMBODIMENTS

The technology disclosed in this specification is not limited to the embodiment described above with use of the foregoing description and drawings, and embodiments such as the following are also encompassed in the technical scope of this specification.

Although a configuration is adopted in which the terminal block 30 is formed through insert molding for disposing the conductive portion 31 in a mold and injecting resin into the mold, there is no limitation thereon. A configuration may be adopted in which the conductive portion 31 and the base portion 45 are separately formed, and the conductive portion 31 is fitted to the base portion 45, for example.

Although a configuration is adopted in which the terminal block 30 includes the magnetic core 60, a configuration may be adopted in which the magnetic core 60 is not provided.

Although the base portion 45 is made of a synthetic resin, there is no limitation thereon. A configuration may be adopted in which a terminal block is made of metal, and insulation is realized by providing an insulating layer made of an insulating adhesive between the conductive portion 31 and the terminal block, for example.

The invention claimed is:
1. A circuit assembly comprising:
a substrate having a conductive path;
an electronic component mounted on the substrate;

an extension portion that is continuous with the terminal portion and extends along a surface of the substrate, wherein the extension portion is enveloped by a magnetic core;

an extension holding portion for holding the extension portion, the extension holding portion extends from at least one of the terminal holding portion and the support portion;

a terminal block that is in direct contact with the substrate;

wherein the terminal block includes a terminal portion that is connected to a counterpart terminal, a terminal holding portion for holding the terminal portion, and a support portion for supporting the terminal holding portion;

the electronic component is disposed between the terminal holding portion and the substrate; and the extension holding portion has a fitting portion that is cut out such that the magnetic core is fitted around the fitting portion.

2. The circuit assembly according to claim 1, wherein a detection portion for detecting a voltage of the terminal portion is branched from the extension portion, and the detection portion is connected to a conductive path of the substrate.

3. The circuit assembly according to claim 2, wherein the terminal portion is an output terminal for outputting power to the counterpart terminal.

4. The circuit assembly according to claim 1,
wherein an extension holding portion for holding the extension portion extends from at least one of the terminal holding portion and the support portion, and the extension holding portion has a fitting portion that is cut out such that the magnetic core is fitted around the fitting portion.

5. The circuit assembly according to claim 1, wherein the terminal portion is an output terminal for outputting power to the counterpart terminal.

6. An electrical junction box comprising:

the circuit assembly according to claim 1; and a case for housing the circuit assembly.

7. The electrical junction box according to claim 6, wherein a detection portion for detecting a voltage of the terminal portion is branched from the extension portion, and the detection portion is connected to a conductive path of the substrate.

* * * * *